United States Patent [19]
Ortberg et al.

[11] Patent Number: 5,966,648
[45] Date of Patent: Oct. 12, 1999

[54] RF CIRCUIT MODULE AND CHASSIS INCLUDING AMPLIFIER

[75] Inventors: Todd Charles Ortberg, Chanhassen; Zakhary Bluband, Plymouth; Glen Backes, Edina, all of Minn.

[73] Assignee: ADC Telecommunications, Inc, Minnetonka, Mich.

[21] Appl. No.: 08/988,047

[22] Filed: Dec. 10, 1997

[51] Int. Cl.⁶ ..................................................... H04B 1/08
[52] U.S. Cl. ........................... 455/347; 455/6.2; 455/349; 455/341; 361/752
[58] Field of Search .............................. 455/6.2, 90, 347, 455/348, 349, 575, 341, 351; 361/733, 752, 785, 796, 801, 802, 814, 816; 174/358; 439/61, 610, 668

[56] References Cited

U.S. PATENT DOCUMENTS

| | | |
|---|---|---|
| D. 234,406 | 2/1975 | Hoshino . |
| D. 259,565 | 6/1981 | Watanabe . |
| D. 316,553 | 4/1991 | Azima . |
| D. 347,844 | 6/1994 | Diachyo . |
| 3,160,456 | 12/1964 | O'Keefe et al. . |
| 4,813,886 | 3/1989 | Roos et al. . |
| 5,546,282 | 8/1996 | Hill et al. . |
| 5,548,248 | 8/1996 | Wang ....................................... 330/288 |
| 5,628,058 | 5/1997 | Hiraki ..................................... 455/349 |
| 5,710,999 | 1/1998 | Iwase et al. ............................. 455/349 |
| 5,903,829 | 5/1999 | Anderson et al. ...................... 455/347 |

OTHER PUBLICATIONS

"Headend Combining/Splitting Network," Cox Communications, undated, 16 pages.

Crutchfield Catalog, Summer 1994, p. 60.

Text and drawings of U.S. Patent Application Serial No. 08/761,525, filed Dec. 6, 1996.

Text and drawings of U.S. Patent Application Serial No. 08/900,187, filed Jul. 25, 1997.

Text and drawings of U.S. Patent Application Serial No. 08/761,776, filed Dec. 6, 1996.

Text and drawings of U.S. Patent Application Serial No. 08/761,723, filed Dec. 6, 1996.

ADC Telecommunications, Inc. Catalog, "Video Signal Distribution Products," 2 front cover pages, pp. 1–47, and back cover page, dated Oct., 1996.

ADC Telecommunications, Inc. catalog "ADC's RF Worx™ RF Distribution and Management Products", 12 pages, dated Dec., 1996.

ADC Telecommunications Inc. document, RF Worx Passive Splitter/Combiner and Directional Coupler User Manual, 23 pages, dated 1997.

Text and drawings of U.S. Patent Application Serial No. 08/762,519, filed Dec. 6, 1996.

*Primary Examiner*—Edward F. Urban
*Assistant Examiner*—Thuan T. Nguyen
*Attorney, Agent, or Firm*—Merchant & Gould P.C.

[57] ABSTRACT

An amplifier module for radio frequency signal circuits includes an electrically conductive housing. Two coax connectors are electrically linked to an amplifier circuit contained within the module. A separate transformer is external to the module. Both the module and the external transformer are mountable to a chassis frame. Other modules are usable in the system in addition to the amplifier module. The transformer can be wall mounted to the chassis frame, or the transformer can be internal to a module which also mounts to the chassis frame.

9 Claims, 12 Drawing Sheets

RF CIRCUIT MODULE AND CHASSIS INCLUDING AMPLIFIER

I. BACKGROUND OF THE INVENTION

1. Field of the Invention

This invention pertains to circuits for broad-band RF (radio frequency) systems. More particularly, this invention pertains to modular RF circuit components.

2. Description of the Prior Art

In the telecommunications industry and more particularly in the video transmission industry, broad-band radio frequency (RF) signals (i.e., 5 MHz to 1 GHz) are carried over coax conductors from a headend to consumers. At the headend of the system, numerous signals are manipulated to achieve a wide variety of functions and objectives. For example, signals carried on the coax cables may need to be amplified, such as for return path applications. Also, the signals from numerous coax cables may be combined onto a single coax conductor. Similarly, a signal on a main coax conductor may be divided into a plurality of signals carried on branch coax conductors. Additionally, signals may be added or removed from a main conductor through directional couplers or the like.

In addition to combining, splitting, diverting or adding signals, the headend will also include apparatus for modifying signals. For example, in order to adequately tune the system, it may be desirable to provide attenuators or the like to attenuate a signal to a desired level. Further, as a broadband RF signal is carried over a length of cable, the high frequency range of the signal may be attenuated more than a low frequency range of the signal. As a result, equalizers are utilized to modify the signal to have a level intensity throughout its frequency range.

Throughout the system, performance characteristics are critical. For example, a common performance criteria is to maintain the flatness of a signal. Flatness refers to maintaining a level intensity of a signal throughout its frequency range. For example, if the signal is attenuated by 2 dB at 1 Ghz, then it is desirable that the signal be attenuated at 2 dB at the 5 Mhz frequency. Further, the system needs to be tuned for impedance matching.

Prior art headends include a wide variety of devices to accommodate and accomplish the functions described above. It is desirable to provide an apparatus to accommodate the various functions required at the headend through a modular construction to permit ease of maintenance and cable management in a headend. Such a device must accommodate the performance characteristics of the headend while permitting the modular construction to enhance the cable management and organization of a headend.

II. SUMMARY OF THE INVENTION

According to a preferred embodiment of the present invention, a chassis and module combination is provided for amplification of a radio frequency signal. The amplifier module comprises a housing of electrically conductive material defining an enclosed interior. The housing has a front face, and an opposite rear face separated by opposite sidewalls and opposite end walls. Each of the faces and sidewalls has a predetermined dimension with the sidewalls being parallel to one another. Each of the end walls has a projecting flange extending in a common plane generally parallel to the sidewalls and with the common plane offset from a central longitudinal axis of the housing. The front face includes end portions extending beyond each of the end walls. Two coax connectors are secured to the rear face for carrying the radio frequency signal to and from the module. A circuit board is contained within an interior of the housing and is positioned generally parallel to and spaced between the sidewalls. The circuit board includes an amplifier circuit selected to amplify a radio frequency signal supplied to one of the coax connectors, and to provide the amplified radio frequency signal to the other of the coax connectors. A power supply port is also located on the rear face of the module. The power supply port is interconnected to the amplifier circuit within the module through a circuit path of the circuit board. A chassis frame for holding the amplifier module comprises a pair of spaced apart walls which are spaced apart by a distance substantially equal to a distance between the end walls of the module. Each of the walls of the chassis frame includes a plurality of aligned grooves sized to slideably receive the projecting flanges of the module. The grooves are spaced apart along the walls to allow for a predetermined number of similarly configured additional radio frequency modules to be received by the chassis frame. The other modules can have the same or other functions. A lock member locks at least one of the end portions of the amplifier module to the chassis frame. A separate transformer is mounted to the chassis frame wherein the transformer is electrically coupled to the power supply port of the amplifier module for powering the amplifier circuit of the amplifier module. The separate transformer can be positioned in a module mountable to the chassis frame in a similar manner as the amplifier module, as desired.

In the preferred embodiment, first and second test coax connectors are secured to the front face of the amplifier module to provide two access monitor test points for the amplifier circuit, one test point to allow for monitoring of the radio frequency signal supplied to the amplifier circuit, the other to allow for monitoring of the radio frequency signal from the amplifier circuit. Further preferred features include a tilt circuit, a power on indicator, and a gain potentiometer for the amplifier module.

III. BRIEF DESCRIPTION OF THE DRAWINGS

IV. DESCRIPTION OF THE PREFERRED EMBODIMENTS

Referring now to the several drawing figures in which identical elements are numbered identically throughout, a description of the preferred embodiments of the present invention will now be provided.

Figure 1:
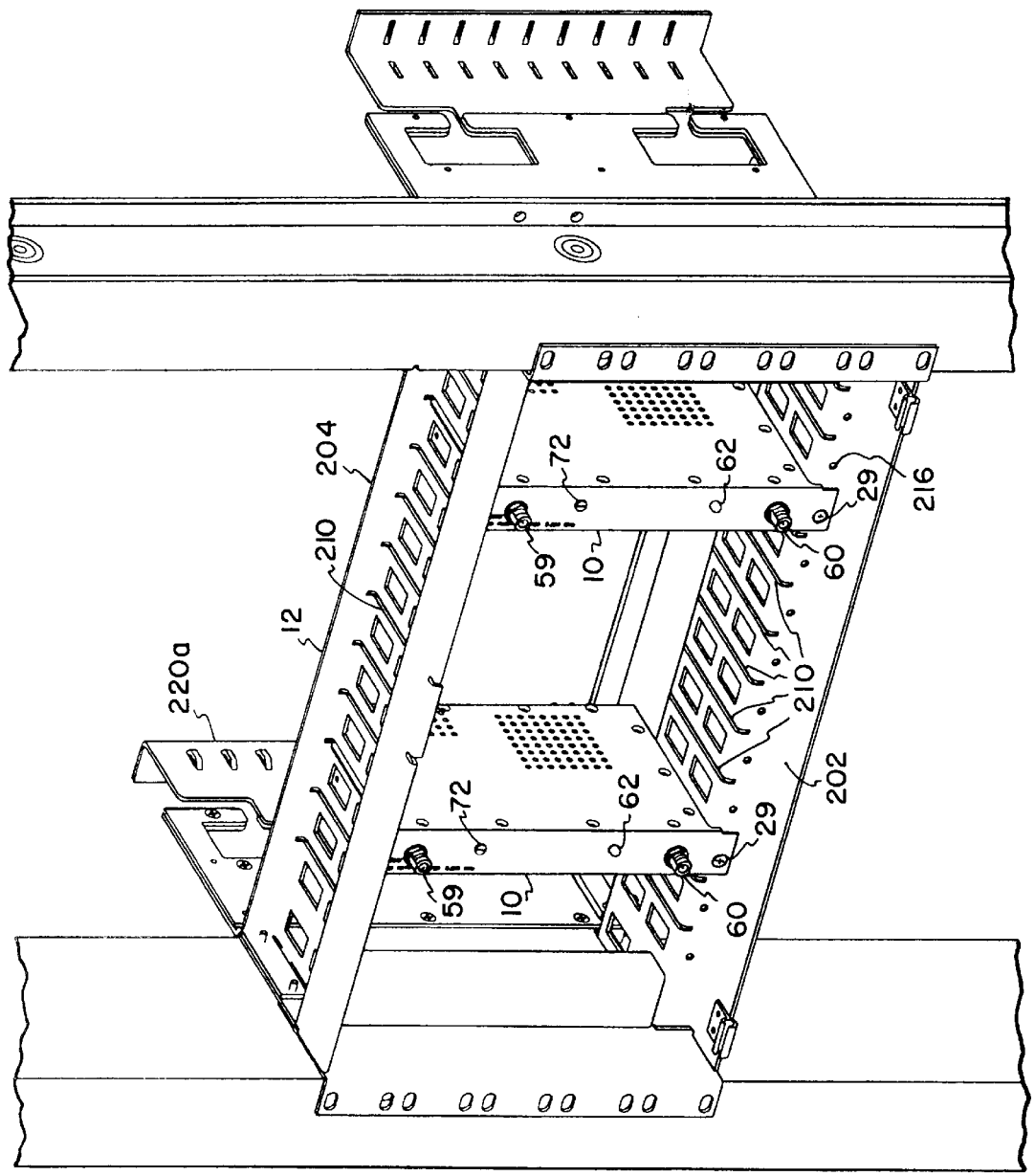
FIG. 1 is a front perspective view of two amplifier modules, vertically mounted, and a chassis frame according to one embodiment of the present invention.
Figure 2:
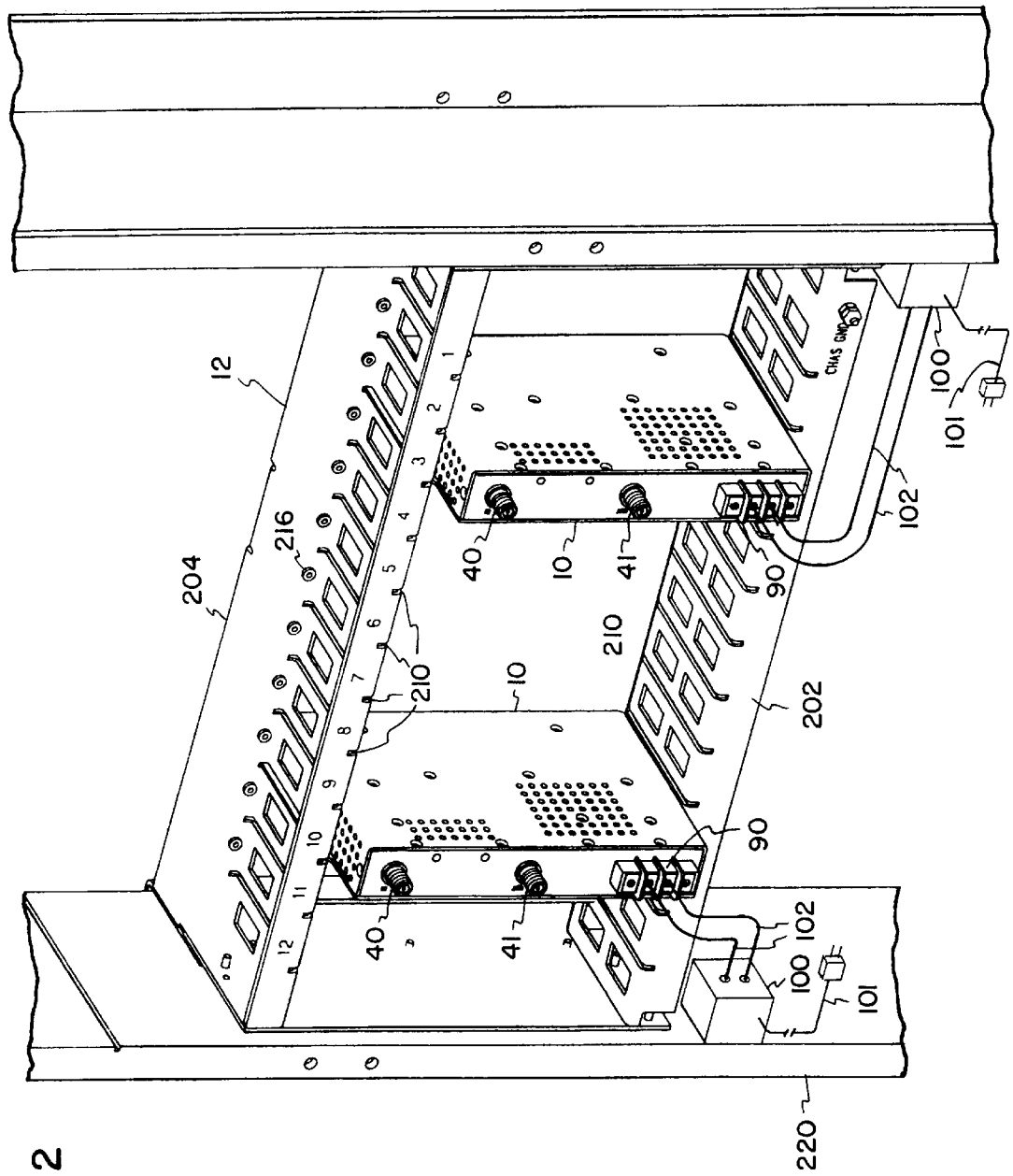
FIG. 2 is a rear perspective view of the amplifier modules and chassis frame shown in FIG. 1, and showing two chassis frame mounted transformers coupled to the amplifier modules.
Figure 3:
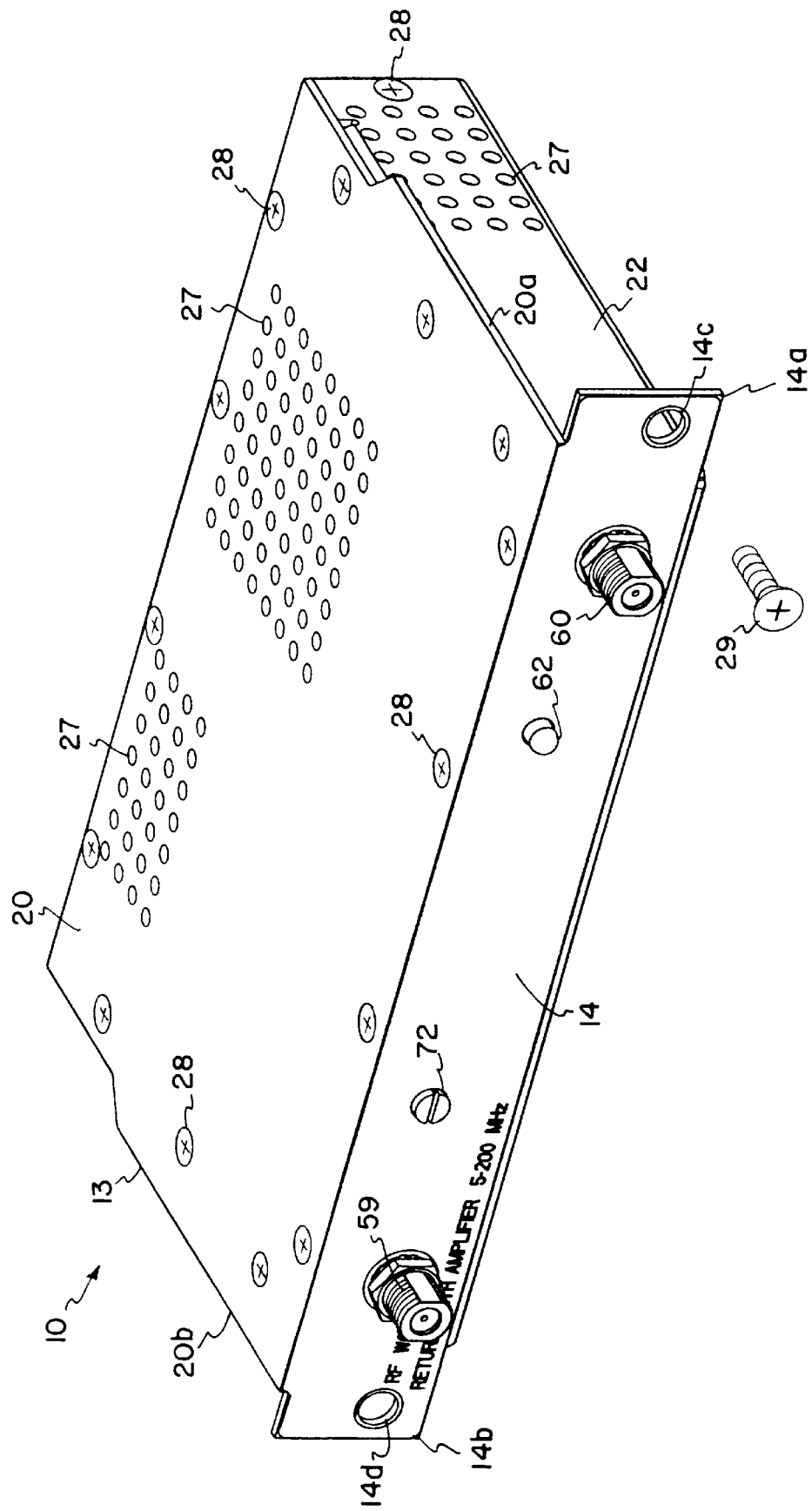
FIG. 3 is a front perspective view of one of the amplifier modules.
Figure 4:
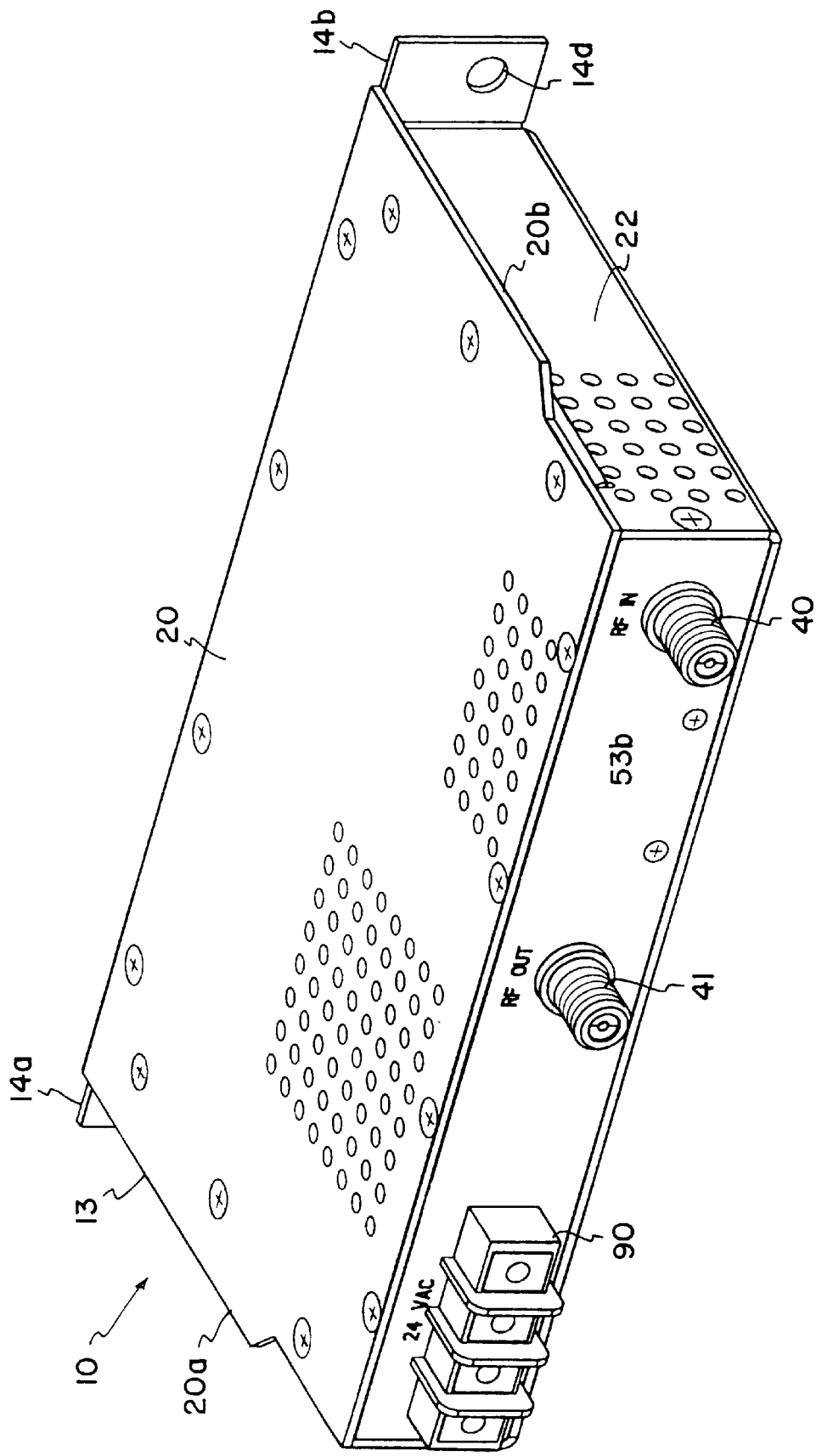
FIG. 4 is a rear perspective view of the amplifier module of FIG. 3.
Figure 5:
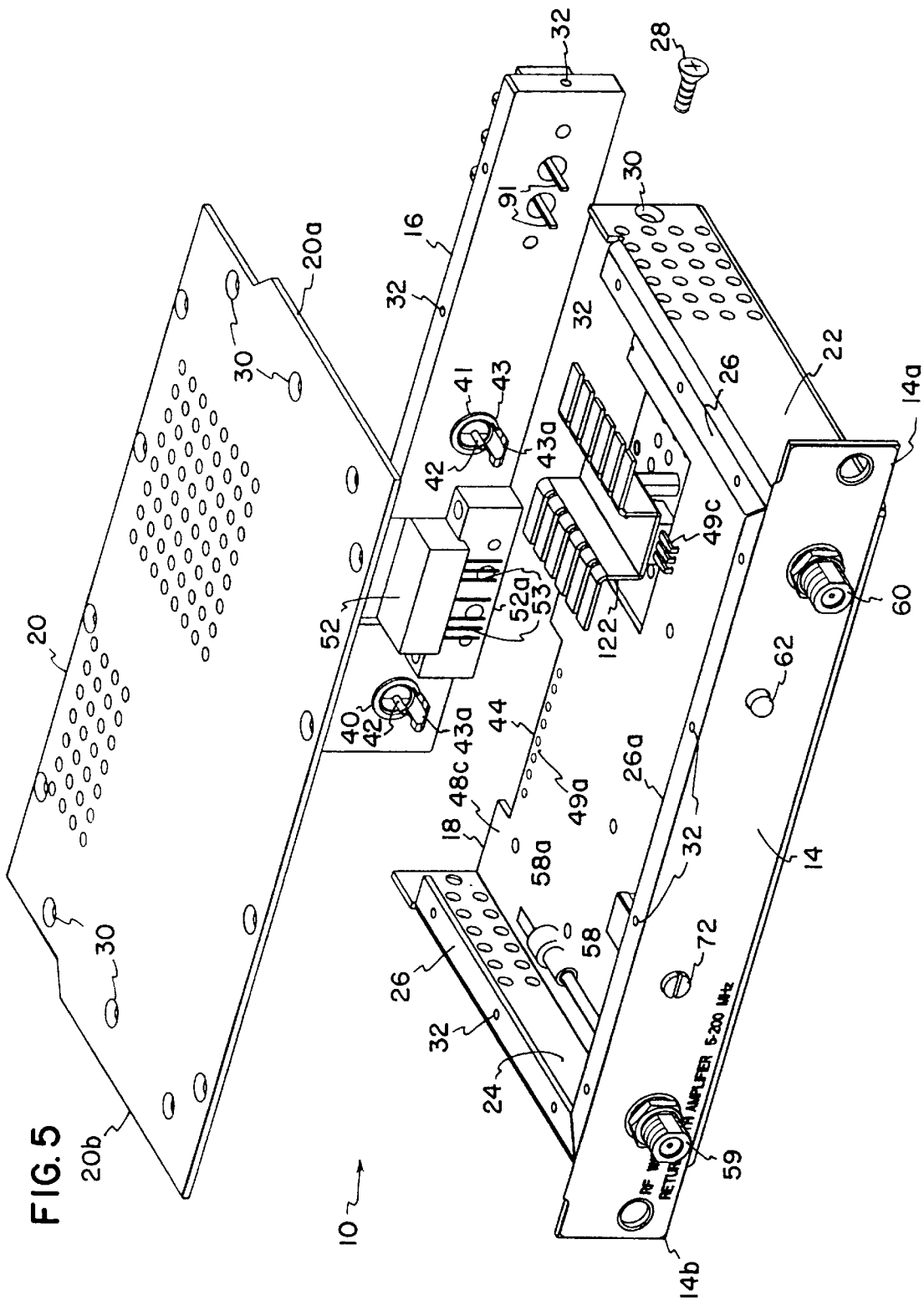
FIG. 5 is an exploded front perspective view of the amplifier module of FIG. 3.
Figure 6:
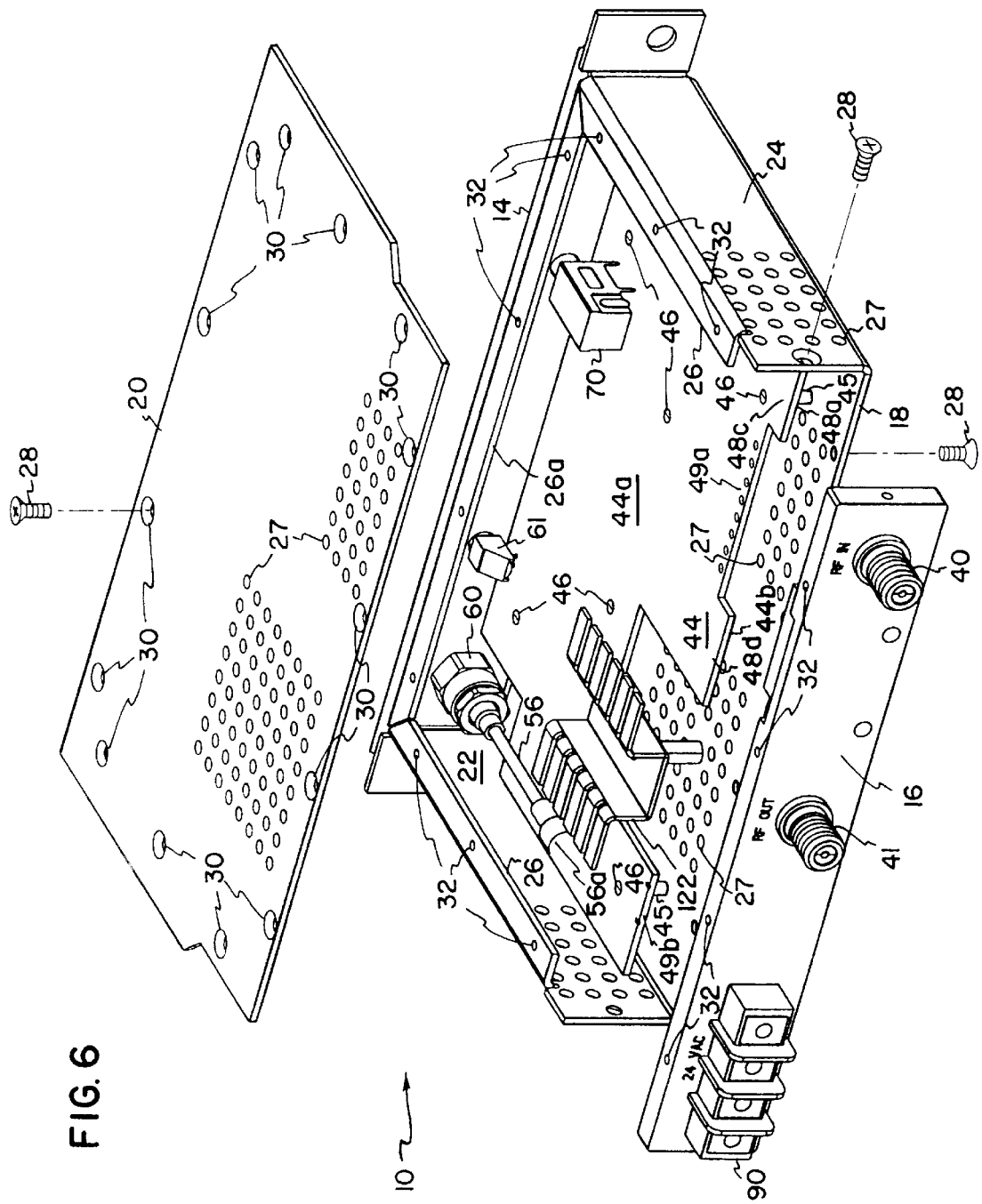
FIG. 6 is an exploded rear perspective view of the amplifier module of FIG. 3.

With initial reference to FIGS. 1 and 2, an amplifier module 10 according to the present invention will be described for use with a chassis frame 12. In FIGS. 1 and 2, two modules 10 are shown. Each module 10 receives a radio frequency signal and provides an amplified radio frequency signal as an output. Module 10 is constructed generally as a modular unit usable with other radio frequency modules and chassis frames as described in U.S. patent application Ser. No. 08/761,525, filed Dec. 6, 1996, the disclosure of which is incorporated by reference. The various modules of U.S. application Ser. No. 08/761,525 include splitter/combiner modules, equalizer modules, and directional coupler modules. These modules and other modules which perform various functions on the radio frequency signals required at the headend are usable with the amplifier module 10 of the present invention.

The module 10 includes a housing 13 having a front face 14, and a rear face 16. The front face 14 and the rear face 16 are separated by opposing sidewalls 18, 20 and opposite end walls 22, 24. The housing 13 is formed of electrically conductive material. Preferably, the material is nickel-plated aluminum. Various vent holes 27 are provided to allow air to enter and exit housing 13.

Sidewall 18 and end walls 22, 24 are integrally formed as a box configuration with walls 22,24 having inwardly protruding peripheral ledges 26. Rear wall 16 is secured to walls 18, 22, 24 by Phillips head screws 28 in aligned holes 30 and threaded holes 32. Front face 14 also has a ledge 26a. The sidewall 20 is fastened to the ledges 26, 26a and rear wall 16 by a plurality of screws 28 received in aligned holes 30 and threaded holes 32.

Sidewall 20 is sized to have a length greater than the longitudinal dimension between walls 22, 24 such that ends 20a, 20b extend beyond end walls 22, 24 as flanges for mounting to chassis frame 12. The front face 14 includes extending end portions 14a, 14b which extend beyond end walls 22, 24. Apertures 14c, 14d receive fasteners 29 to lock each module 10 to chassis frame 12.

Two coax connectors 40, 41 are secured to the rear face 16. Each of coax connectors 40, 41 is a 75 ohm F-type connector press fit into rear face 16 and includes a central conductor 42 surrounded by a grounded shield 43. The grounded shields 43 of the coax connectors 40, 41 are in direct physical and electrical contact with the electrically conductive material of the rear face 16.

Contained within the interior of the housing 12 is a printed circuit board 44. The printed circuit board 44 is supported on posts 45 by screws 46. The posts 45 are electrically conductive and connected to wall 18. Printed circuit board 44 includes a component side 44a and a ground side 44b. The ground side 44b opposes the wall 18 and the component side 44a opposes the wall 20. The printed circuit board 44 is maintained in parallel, spaced relation between the walls 18, 20 by posts 42.

Figure 7:
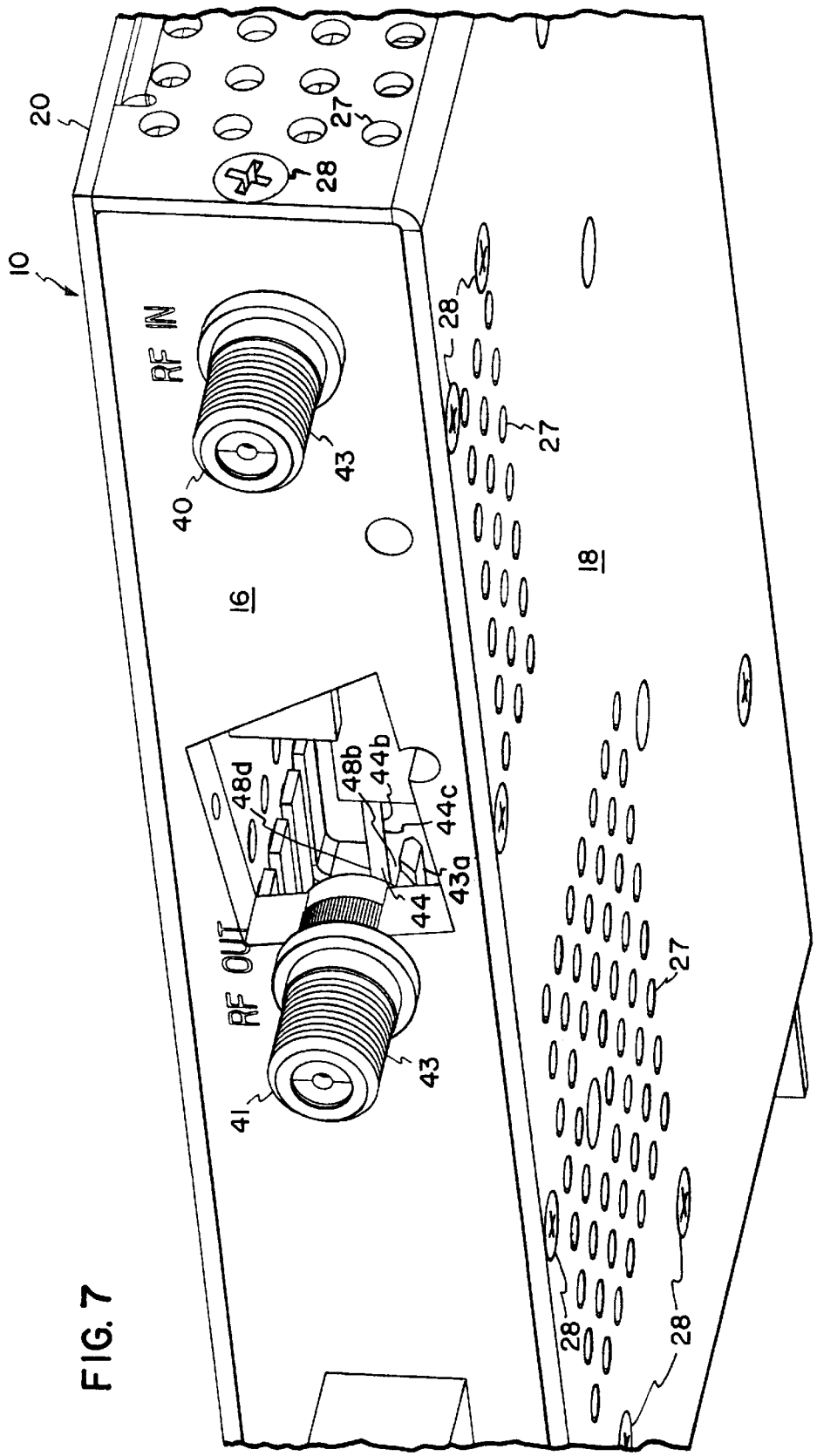
FIG. 7 is an enlarged rear perspective view of a portion of the amplifier module, including portions of the housing broken away for viewing internal components.

A layer 44c (FIG. 7) of electrically conductive material (such as a sheet layer of copper) is provided on the exterior surface of surface 44b. Two connection locations 48a, 48b are provided on the ground side 44b of the printed circuit board 44. Each of the connection locations 48a, 48b includes a ground connection for connecting the ground shield at the tabs 43a of the coax connectors 40, 41 to the conductive layer 44c, such as by soldering. Central conductors 42 of each connector 40, 41 are also soldered to printed circuit board 44 to component side 44a at connection locations 48c, 48d.

Figure 8:
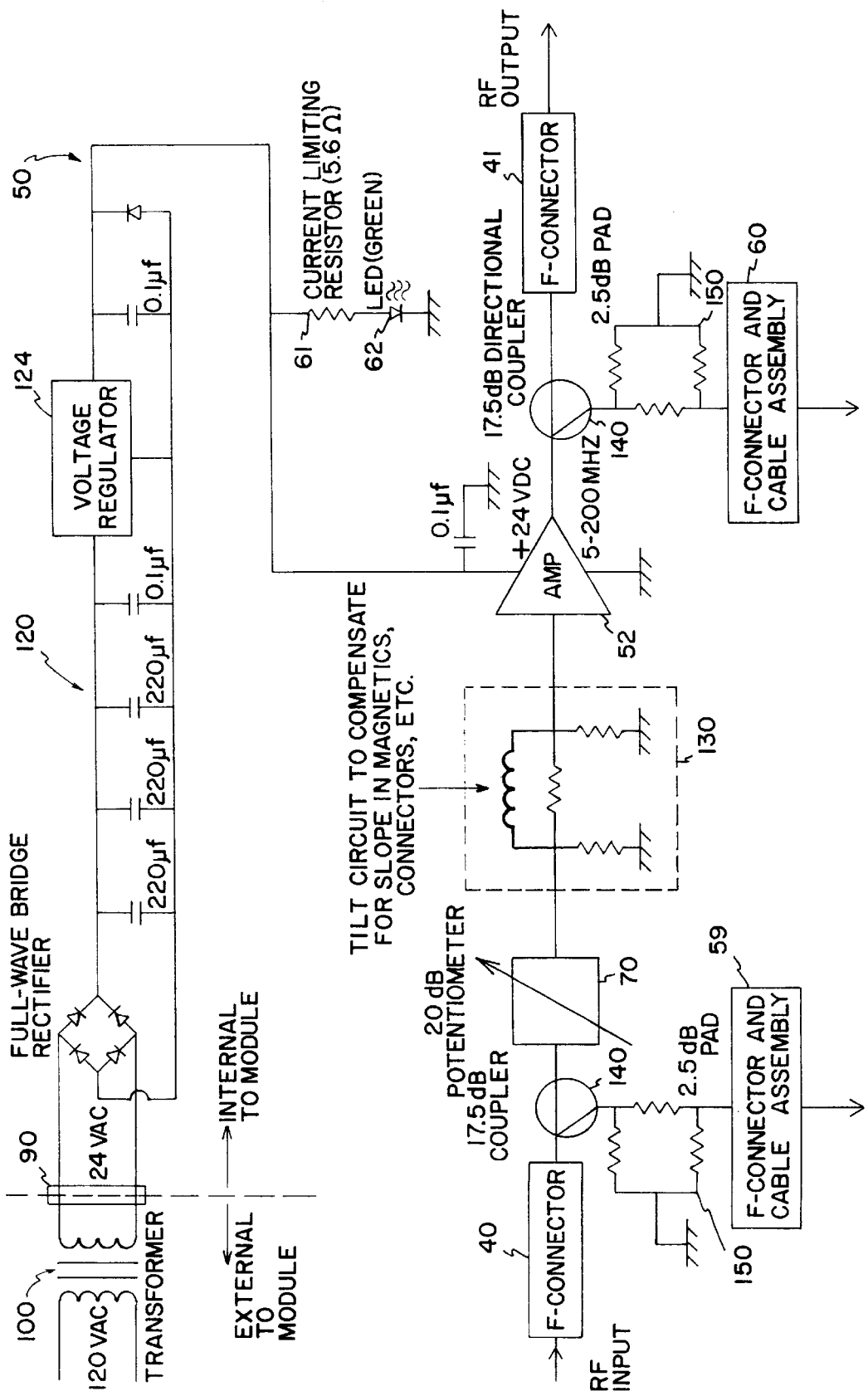
FIG. 8 is an electrical schematic of the amplifier module and external transformer.
Figure 9:
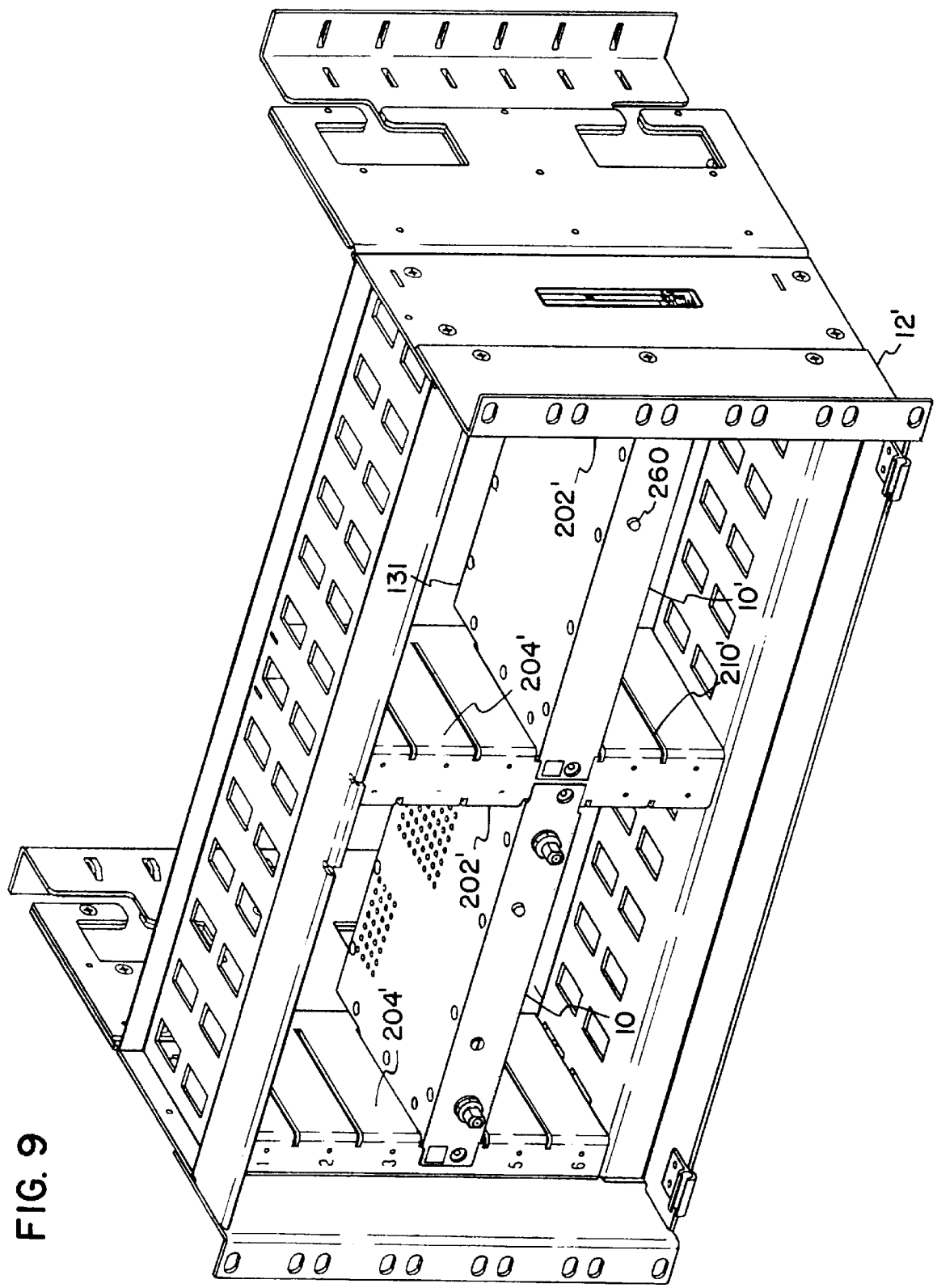
FIG. 9 is a front perspective alternative chassis frame including a horizontal mounting of the modules, and where one of the modules is configured and arranged to house a transformer for an amplifier module.
Figure 10:
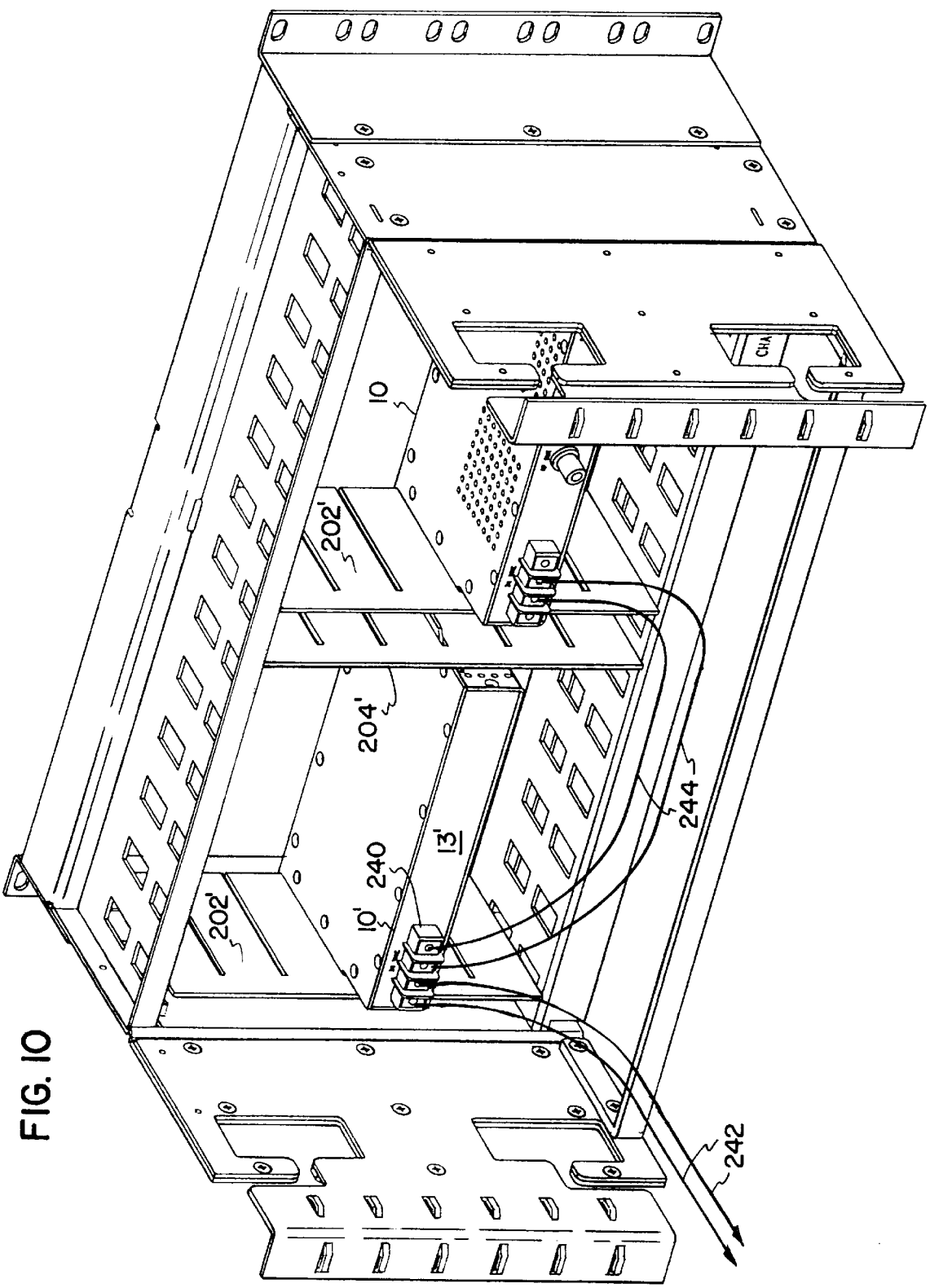
FIG. 10 is a rear perspective of the embodiment of FIG. 9.
Figure 11:
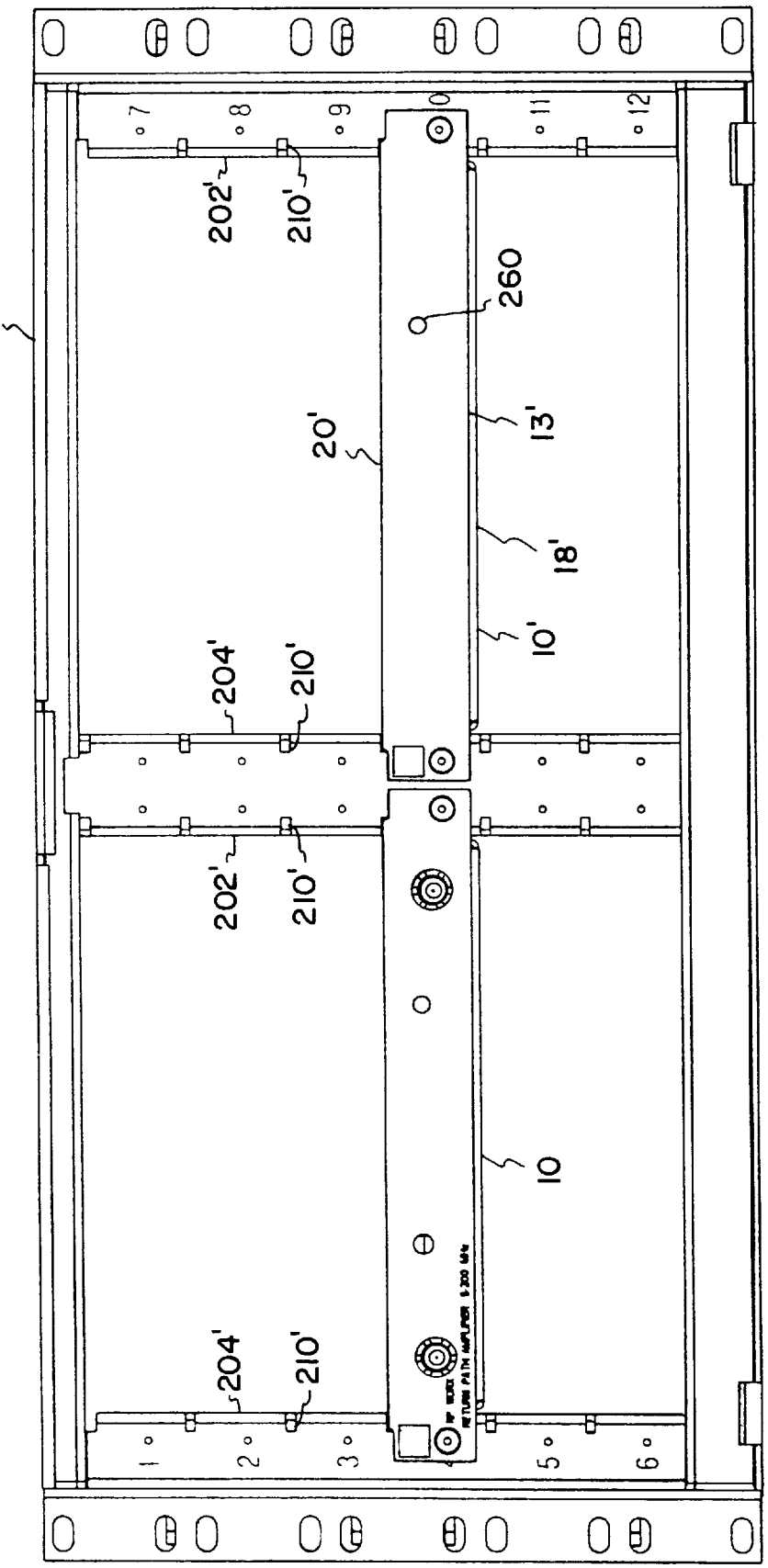
FIG. 11 is a front view of the embodiment of FIG. 9.
Figure 12:
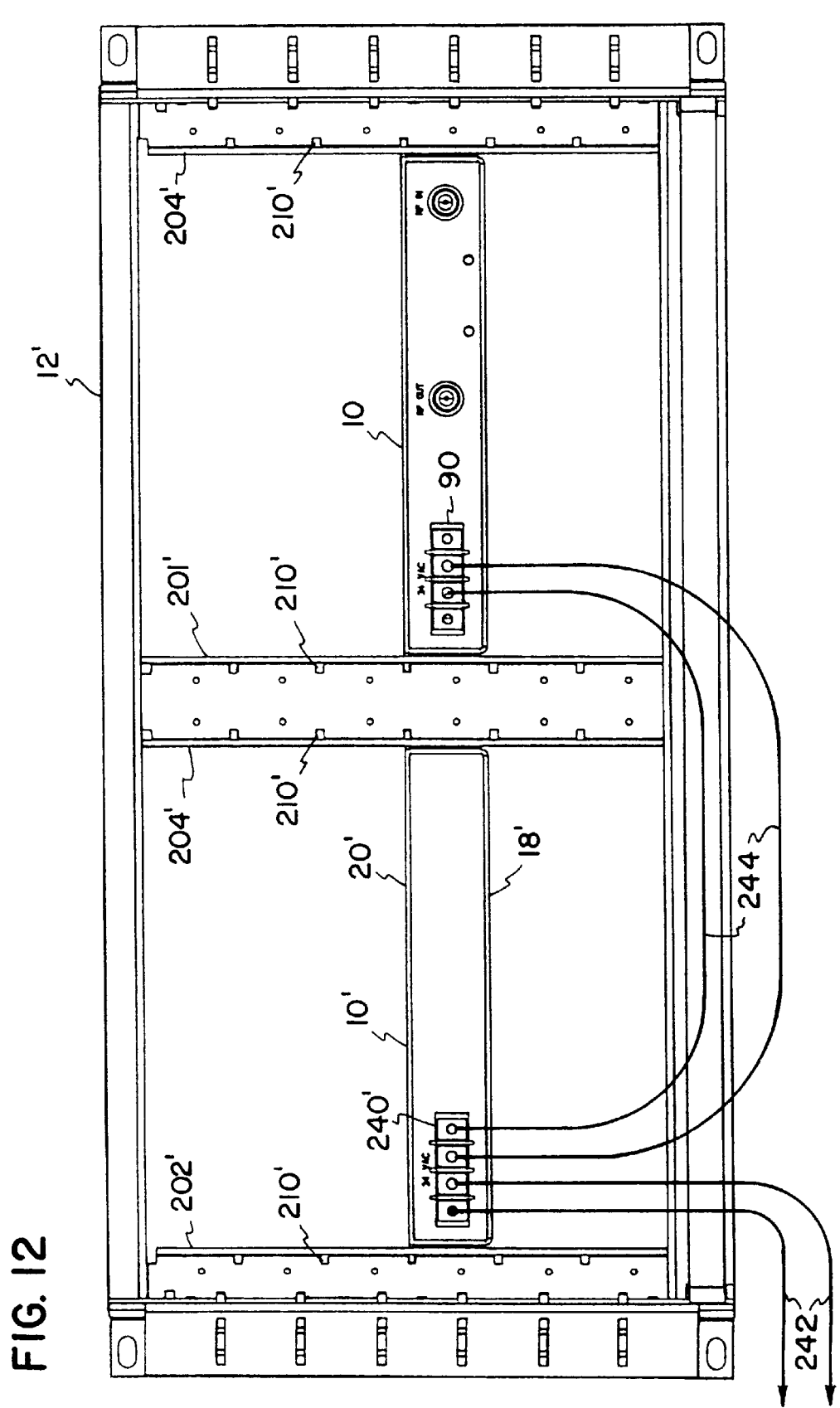
FIG. 12 is a rear view of the embodiment of FIG. 9.

A plurality of circuit components are disposed on the component side 44a of the printed circuit board 44 (leaded through hole or surface mount). In the embodiment shown, an amplifier circuit 50 (see FIG. 8) is included in the circuit components. An amplifier module 52 is screwed to the rear face 16 at screw holes 52b so as to form a heat sink. Pins 53 of the amplifier module 52 plug into sockets on the printed circuit board 44 at connection location 49a. Two cable assemblies 56, 58 run from the printed circuit board 44 at connection locations 56a, 58a to the front face 14. Front face 14 includes two 75 ohm F-type coax cable connectors 59, 60 mounted to front face 14, such as with a threaded nut, to form termination points of cable assemblies 56, 58 which provide front access monitor test points for monitoring the radio frequency signal before and after amplification. An indicator circuit 61 mounted to printed circuit board 44, and including an LED 62 on the front face 14 indicates power on. A gain potentiometer 70 with an access adjustment point 72 is also on the front face 14 and can be adjusted (from 0 to 20 dB in the example shown) with a flat head screwdriver. A power supply port 90 is mounted adjacent to rear face 16. Pins 91 of port 90 connect to printed circuit board 44 at connection location 49b. A transformer 100 connected via cord 101 to an external power source converts 120 volts of alternating current to 24 volts of alternating current. Transformer 100 supplies the 24 volts of alternating current to the power supply port 90 through wires 120. Alternatively, the power input to the amplifier module 10 can be minus 48 volts of direct current to the transformer 100, whereby a suitably configured transformer 100 would convert it to 24 volts of direct current to power the amplifier circuit 50.

A full-wave bridge rectifier circuit 120 is provided as part of the power supply circuit for amplifier circuit 50 of amplifier module 10. A heat sink 122 is mounted to printed circuit board 44 at connection location 49c to provide a heat sink for voltage regulator 124 of rectifier circuit 120. A tilt circuit 130 is provided to compensate for slope in the magnetic and connector features. Such a circuit flattens out the frequency response of the amplifier circuit 50. The cable assemblies 56, 58 including the monitor coax connectors 59, 60 draw a 20 dB signal due to the 17.5 dB couplers 140 and the 2.5 dB pads 150.

Chassis frame 12 includes spaced apart walls 202, 204 spaced apart by a distance substantially equal to a distance between the end walls 22, 24 of the module 10. Each of the walls 202, 204 includes a plurality of vertically aligned grooves 210. The grooves 210 are sized to slideably receive the projecting flanges 20a, 20b of the module 10 such that a module may be slideably inserted into the chassis frame 12 with the modules 10 vertically positioned. In the embodiment shown, there are multiple pairs of vertically aligned grooves 210 such that additional modules may be inserted into the chassis frame 12. Since the flanges 20a, 20b of the modules 10 are offset from a longitudinal plane of the module 10, the grooves 210 are offset from module receiving spaces so that the entire open space between the sidewalls of the chassis frame may be filled with modules. Also, the grooves 210 are spaced apart a distance selected such that as modules as slideably inserted into the frame, adjacent modules are positioned with a small spacing between opposing sidewalls of adjacent modules. The locking fasteners 29 are provided through the projecting end portions 14a, 14b of the front faces 14 of the module 10 for receipt in corresponding threaded locking holes 216 provided on walls 202, 204 of chassis frame 12.

Transformer 100 is shown separate from amplifier module 10. Transformer 100 is vertically mounted to a vertical side piece 220 of chassis frame 12. Chassis frame extension 220a (not illustrated in FIG. 2) could also be a mounting location for transformer 100.

From time to time, a customer or purchaser of the module 10 may desire to hold the modules and other radio frequency modules in a horizontal alignment rather than the vertical alignment of FIGS. 1 and 2. An alternative chassis frame 12' is shown in FIGS. 9–12 for holding the modules 10 in a horizontal alignment. Two pairs of walls 202', 204' are provided, and each wall has the flange receiving grooves 210'.

Instead of transformer 100 being a wall mounted unit separate from module 10, the transformer can also be internal to its own module 10' also separate from amplifier module 10 which is received by one of the chassis frames 12, 12'. FIGS. 9–12 illustrate transformer module 10' having an internal transformer disposed within housing 13'. Power supply port 240 links an external power source (i.e., 120 volts a.c.,–48 volts d.c.) over wires 242 to transformer module 10'. The internal transformer outputs the proper voltage through port 240 over wires 244 to the power supply port 90 of amplifier module 10. Power on indicator 260 provides visual output whether transformer module 10' is supplied with external power. Also, transformer module 10' can be two or more modules 10 in width between walls 18' and 20', as desired, to provide more internal space for components.

Having described the present invention in a preferred embodiment, modifications and equivalents may occur to one skilled in the art. It is intended that such modifications and equivalents shall be included within the scope of the claims which are appended hereto.

What is claimed is:

1. A chassis frame and module combination comprising:
   a) an amplifier module having:
      1) a housing of electrically conductive material defining an enclosed interior; said housing having a front face and an opposite rear face separated by opposite sidewalls and opposite end walls, with each of said faces and sidewalls being of predetermined dimension and with said sidewalls being parallel to one another; each of said end walls having a projecting flange extending in a common plane generally parallel to said sidewalls and with said common plane offset from a central longitudinal axis of said housing; said front face including end portions extending beyond each of said end walls;
      2) two coax connectors secured to said rear face with an outer shield of said coax connectors electrically coupled to said housing;
      3) a circuit board contained within said interior and positioned generally parallel to and spaced between said sidewalls; said circuit board having a component side opposing a first of said sidewalls and a ground side opposing a second of said sidewalls, said ground side including a layer of electrically conductive material electrically connected to said housing; a plurality of connection locations on said circuit board, each of said connection locations including a ground connection for connecting ground shields of coax cables to said layer of electrically conductive material; said component side of said circuit board including a circuit component interconnected with said connection locations through a circuit path; said circuit component including an amplifier circuit selected to amplify a radio frequency signal supplied to one of said coax connectors and to provide an amplified radio frequency signal to the other of said coax connectors; said coax connectors connected to said connection locations, each of said outer shields of said coax connectors connected to said ground connections of said connection locations;
      4) A power supply port located on said rear face; said power supply port interconnected to said amplifier circuit through a circuit path of said circuit board;
   b) a chassis frame including a pair of spaced apart walls, said walls spaced apart by a distance substantially equal to a distance between said end walls of said module; each of said walls including a groove, each groove sized to slideably receive one of said projecting flanges;
   c) a lock member for locking at least one of said end portions to said chassis frame;
   d) a transformer separate from said amplifier module, said transformer mounted to said chassis frame, said transformer electrically coupled to said power supply port of said amplifier module for powering said amplifier circuit.

2. The chassis frame and module of claim 1, further comprising a first test coax connector secured to said front face; said first test coax connector electrically coupled to a circuit path of said circuit board to monitor the radio frequency signal supplied to said amplifier circuit.

3. The chassis frame and module of claim 2, further comprising a second test coax connector secured to said front face; said second test coax connector electrically coupled to a circuit path of said circuit board to monitor the radio frequency signal from said amplifier circuit.

4. The chassis frame and module of claim 1, further comprising a test coax connector secured to said front face; said test coax connector electrically coupled to a circuit path of said circuit board to monitor the radio frequency signal from said amplifier circuit.

5. The chassis frame and module of claim 1, wherein said circuit component of said amplifier module further includes a tilt circuit.

6. The chassis frame and module of claim 1, wherein said circuit component of said amplifier module further includes a power on indicator, said power on indicator including an LED positioned on said front face.

7. The chassis frame and module of claim 1, wherein said circuit component of said amplifier module further includes a gain potentiometer, and said front face including an adjustment access point to adjust said gain potentiometer.

8. The chassis frame and module of claim 1, further comprising a transformer module for holding the transformer, the transformer module having a housing with a front face, a rear face, opposite sidewalls and end walls, each of the end walls having a projecting flange, each projecting flange received in one of the pairs of aligned grooves of the walls of the chassis frame.

9. The chassis frame and module of claim 1, wherein the pair of spaced apart walls is a first pair, and wherein the chassis frame includes a second pair of spaced apart walls spaced apart a distance substantially equal to the first pair, each wall of the second pair including a flange receiving groove for receiving an additional radio frequency module configured and arranged with a housing like the housing of the amplifier module.

* * * * *